(12) United States Patent
Advani

(10) Patent No.: US 7,380,230 B2
(45) Date of Patent: May 27, 2008

(54) TIMING SKEW MEASUREMENT SYSTEM

(75) Inventor: Hiten Advani, Delhi (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 206 days.

(21) Appl. No.: 11/220,386

(22) Filed: Sep. 6, 2005

(65) Prior Publication Data

US 2006/0136853 A1 Jun. 22, 2006

(30) Foreign Application Priority Data

Sep. 6, 2004 (IN) .......................... 1688/DEL/2004

(51) Int. Cl.
*G06F 17/50* (2006.01)
(52) U.S. Cl. .............................................. 716/6; 716/5
(58) Field of Classification Search ................. 716/5–6
See application file for complete search history.

(56) References Cited

U.S. PATENT DOCUMENTS 5,553,276 A * 9/1996 Dean .......................... 713/500
6,470,483 B1 10/2002 Rodriguez et al.

\* cited by examiner

*Primary Examiner*—Vuthe Siek
(74) *Attorney, Agent, or Firm*—Lisa K. Jorgenson; Robert Iannucci; Seed IP Law Group PLLC

(57) ABSTRACT

An improved timing skew measurement system includes a selector receiving a plurality of input signals whose relative skew is to be measured, a selection controller connected to the select inputs of the selector for selecting one of the input signals and a sequential logic element having a first input connected to the output of the selector. The system further includes a controllable clock generator capable of providing an adjustable clock edge position connected to a second input of the sequential logic element, the first and second inputs being associated by at least one defined timing relationship for correct operation of the sequential logic element, and an output analyzer having one input connected to the output of the sequential logic element, a first output connected to the input of the selection controller and a second output connected to the control input of the controllable clock generator.

19 Claims, 5 Drawing Sheets

TIMING SKEW MEASUREMENT SYSTEM

BACKGROUND OF THE INVENTION

1. Field of the Invention

The present invention relates to an improved timing skew measurement system.

2. Description of the Related Art

The testing of digital or mixed signal integrated circuits, requires the testing of internal node timings. Such measurements are typically performed by placing a sequential element such as latch or flip-flop at the node of interest, with the node connected to the data input of the sequential element. The output of the sequential element is typically brought out to an I/O pin. Measurements are then made by varying the operating frequency until the sequential element fails to latch the correct node value.

Such testing is particularly important on devices that require an on chip clock generator for internal clock de-skew and frequency synthesis while supporting advanced features of clock advance or phase shifts to address specific performance requirements. In such devices it is necessary to accurately measure the skew or phase difference, which may be a design parameter or operation parameter to ensure performance benchmarking of the device or product feature. Accurate measurement of clock skew is necessary for fault diagnosis, design improvement and semiconductor process improvement.

U.S. Pat. No. 6,470,483 describes a method that requires introducing on chip programmable delay in one of the internal clock signals until failure is detected while reading the flip-flop output. It requires therefore one of the internal clocks to be either controlled directly for delay or introduction of delay element circuits which can be programmed for variable delay. The circuit is developed in accordance with the flow diagram shown in FIG. 1.

This prior art allows direct control of clock frequency of sequential element through IO pins connected to an IC tester. The limitation of this method is observed in the inability of a regular medium to high cost tester to operate at high frequencies beyond 500-700 Mhz while on chip clock generator output clocks may ramp beyond tester frequency limitation. Advanced clock generators provide output clocks that are synchronized to the input clock of the IC and at the same time perform advanced clock synthesis, controlled/programmable phase shifts and duty cycle manipulations. Another limitation of conventional skew measurement methods is in the dependence of measurement accuracy on test data placement and output edge placement accuracy of the tester, which may cumulate to more than $10^{-10}$ seconds. The phase measurements require time resolutions to the multiple of 10 ps, which are not measurable by an off-chip tester. Changing the external frequency of clock as described in the prior art will not control flip-flop output as all phase shifted signals will track the input clock frequency without controlling skew.

BRIEF SUMMARY OF THE INVENTION

One embodiment of the invention provides a circuit for measurement of internal skew of multiple clock nodes generated from a common source.

Another embodiment of the present invention provides a method for measurement of internal skew of multiple clock nodes synchronized across multiple sources.

Another embodiment of the invention provides a method for characterization of internal skew of multiple clock nodes generated from a common source.

Another embodiment of the invention provides a circuit characterization and testing and more particularly, provides a method and an apparatus for characterization of internal skew of multiple clock nodes generated from a common source or synchronized across multiple sources.

One embodiment of the present invention provides an improved timing skew measurement system comprising:

a selector receiving a plurality of input signals whose relative skew is to be measured, a selection controller connected to the select inputs of the selector for selecting one of the input signals, a sequential logic element having a first input connected to the output of the selector, a controllable clock generator capable of providing an adjustable clock edge position connected to a second input of the sequential logic element, the first and second inputs being associated with each other by at least one defined timing relationship for correct operation of the sequential logic element, and an output analyzer having one input connected to the output of the sequential logic element, a first output connected to the input of the selection controller and a second output connected to the control input of the controllable clock generator.

In one embodiment, the selector is a multiplexer.

In one embodiment, the sequential logic element is a D-flipflop.

In one embodiment, the controllable clock generator and the output analyzer are elements of an automatic test system device.

On embodiment of the present invention further provides a method for performing timing skew measurement that includes the steps of:

a. selecting one of the plurality of input signals whose relative skew is to be measured, b. applying the selected input signal to a first input of a sequential logic element, c. applying an adjustable clock signal to a second input of said sequential logic element that requires defined timing delays to be maintained relative to the first input for a first operation of the sequential logic element, d. analyzing the output of the sequential logic element for correctness, e. adjusting the clock edge position of the controllable clock signal until the behavior of the sequential logic element changes from the first operation to a second operation and recording the clock edge position for such transition, f. selecting each of the input signals in turn and repeating the sequence of steps b) to e) until all the inputs have been processed, and g. determining timing skew between the input signals by comparing the values obtained in step e) for each input signal.

In one embodiment the first operation is proper operation and second operation is incorrect operation.

BRIEF DESCRIPTION OF THE SEVERAL VIEWS OF THE DRAWINGS

The invention will now be described with reference following accompanying drawings.

DETAILED DESCRIPTION OF THE INVENTION

Figure 1:
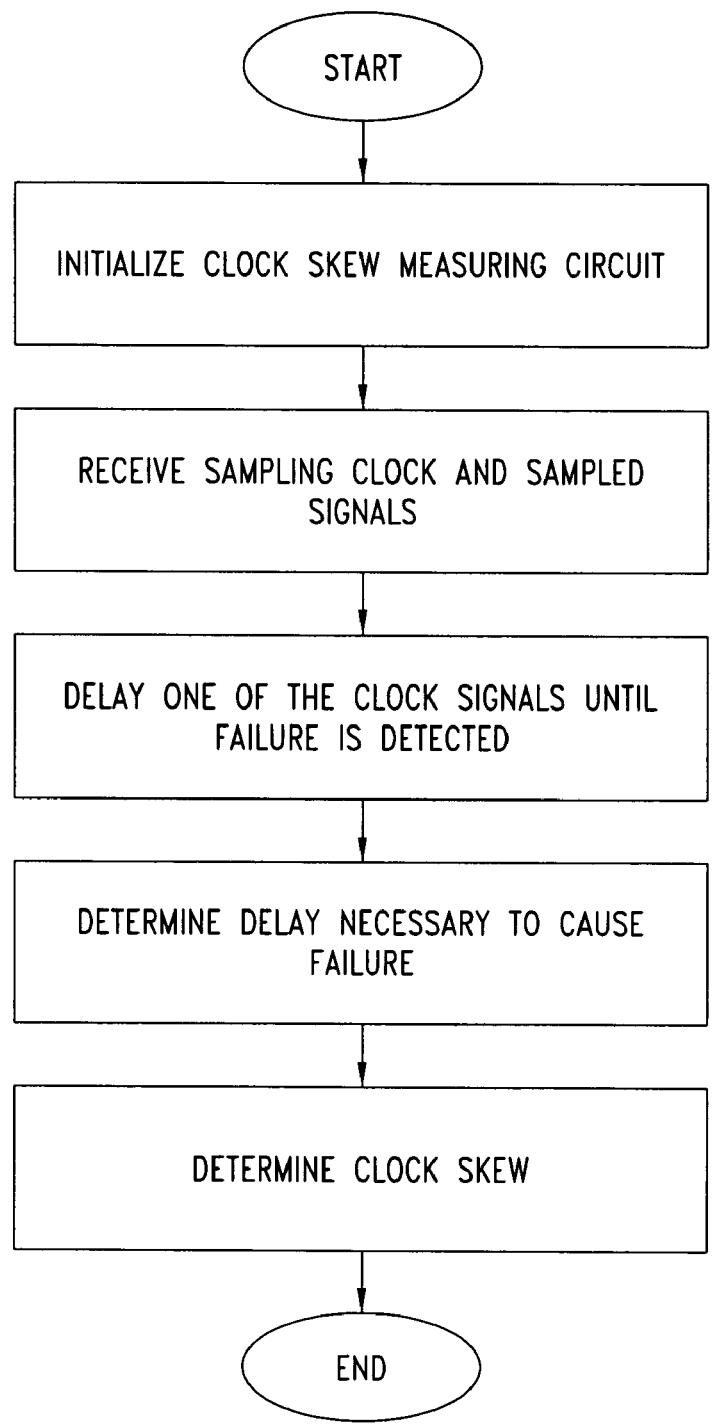
FIG. 1 shows a flow diagram according to U.S. Pat. No. 6,470,483.

FIG. 1 shows a flow diagram according to the U.S. Pat. No. 6,470,483 and has already been discussed and the heading background of the invention.

Figure 2:
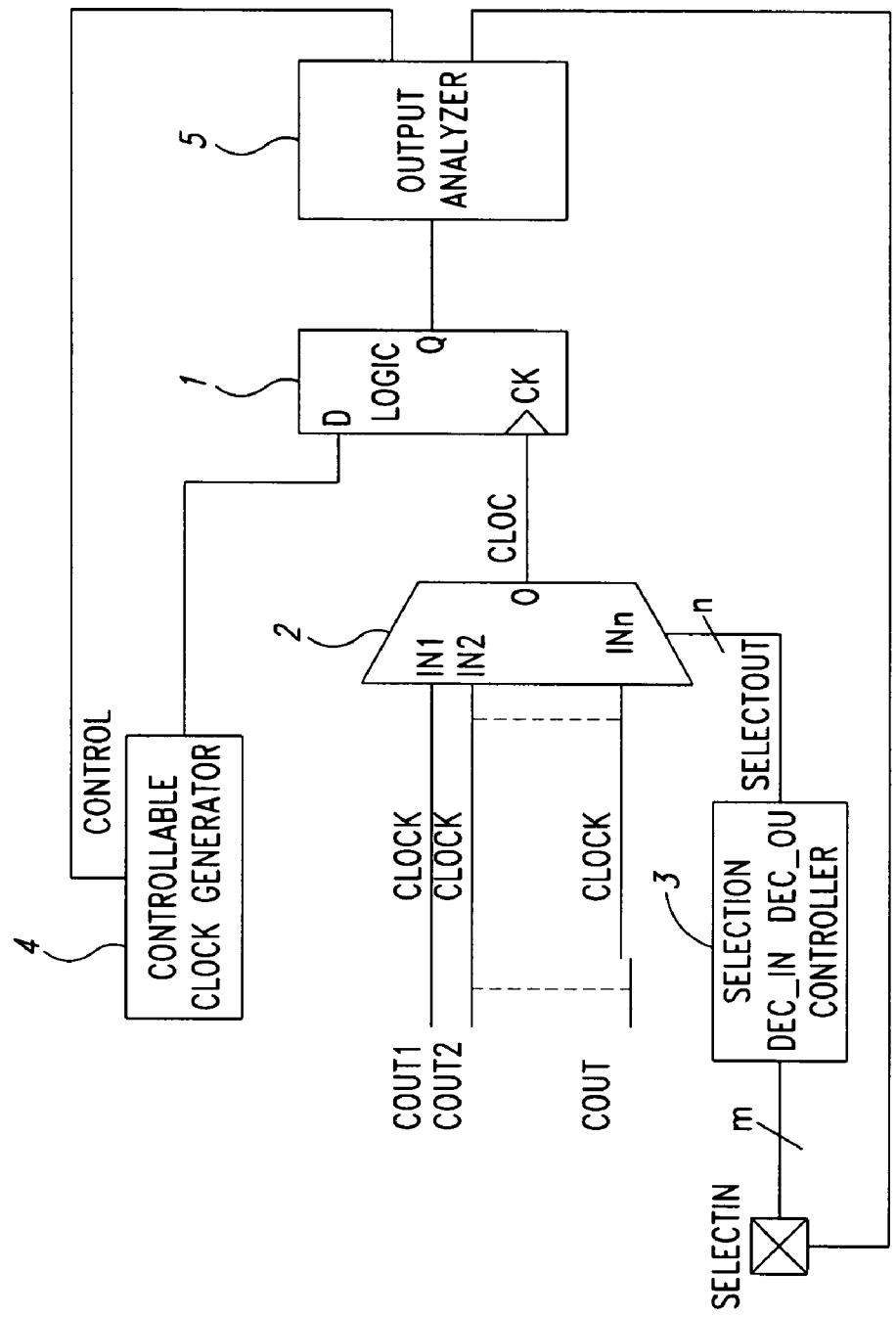
FIG. 2 shows a circuit diagram for on chip characterization according to one embodiment of the present invention.

FIG. 2 shows a measurement instrument according to one embodiment of the present invention. The measurement circuit has a selector 2 that receives a plurality of clock signals CLOCK1, CLOCK2 . . . CLOCKn differing by skew which may be intentional and is to be measured at inputs IN1, IN2 . . . INn respectively. The selector 2 is controlled by a selection control circuit 3 that receives input from the input pin SELECTIN and provides an output signal SELECTOUT that enables the selector 3 to select one of the clock signal inputs from said plurality of clock signals. The selection control circuit 3 is configured as a part of the initialization sequence before CLOCKIN is applied to the circuit from the IC tester. In order to measure relative phase difference or skew accurately, the paths of all clock outputs should be balanced in terms of delay. The output of the selector 3 is connected to a logic block 1 that receives as its second input, a controllable clock signal from a controllable clock generator 4. The output of the logic block 1 provides a digital signal corresponding to the selected clock signal for enabling on chip characterizing of clock skew.

The selector 2 is any selection means including multiplexers. For the case of a multiplexer selector, the selection control circuit 3 can be realized using a counter. The selector 2 can receive input from any digital circuit. Logic block 1 is any logic block that can generate a digital signal on receipt of a clock edge from the selector 2. Logic block 1 can be realized using any flip-flop, more particularly using a D-flop. The clock input of the D flip flop is connected to the output of the selector 2 and the controllable clock signal is connected to the data input D of the D Flip flop. Whenever a clock edge is received at the clock input of the D-flip flop its output toggles, and is registered for clock characterization.

The present circuit therefore does not require any delay control module and provides a method and apparatus for measurement of internal clock skew of the desired on chip generated clock signals.

Figure 3:
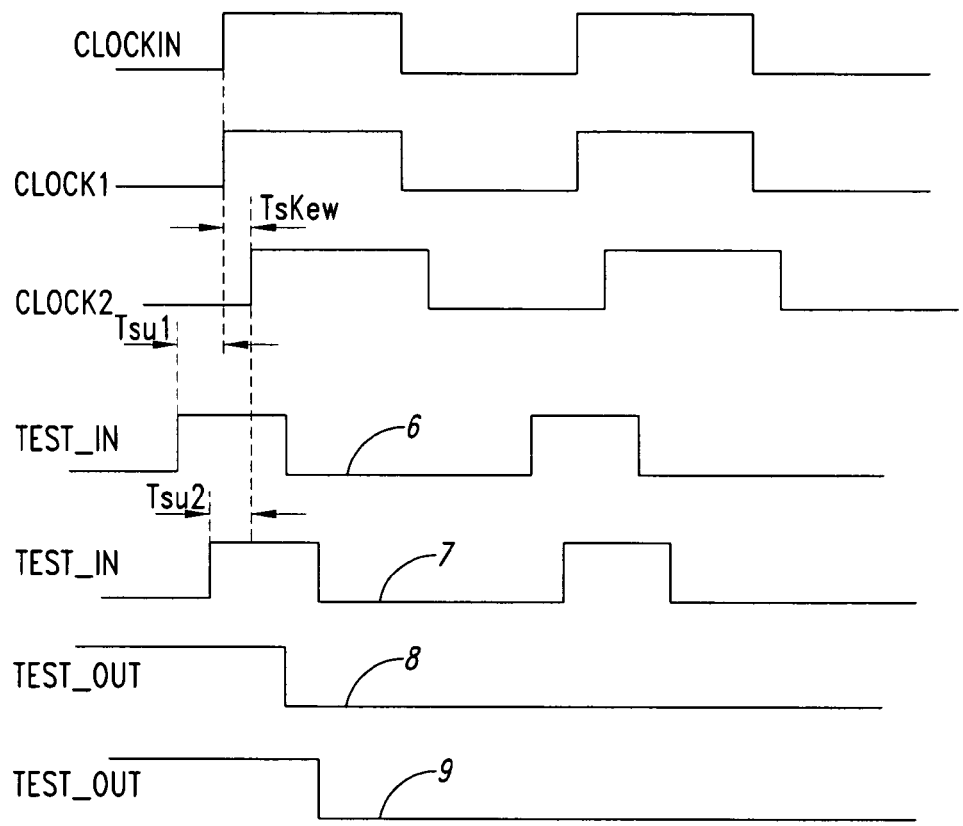
FIG. 3 shows a timing diagram

FIG. 3 is a timing diagram showing CLOCKIN used as an external clock and CLOCK1, CLOCK2 as generated clocks de-skewed relative to CLOCKIN except for relative skew $T_{skew}$ between CLOCK1 and CLOCK2. The controllable clock generator provides a clock signal TEST_IN 6 that is applied at a setup time limit of $T_{su1}$ relative to the external clock. The controllable clock generator provides a clock signal TEST_IN 7 that is applied at set up time limit $T_{su2}$ relative to CLOCK2 as the clock for which skew measurement is desired. TEST_OUT 8 shows the output of logic block 1 t when it fails to capture the clock signal TEST_IN 6. TEST_OUT 9 shows the output of flip-flop 1 when it fails to capture the clock signal TEST_IN 7.

Figure 4:
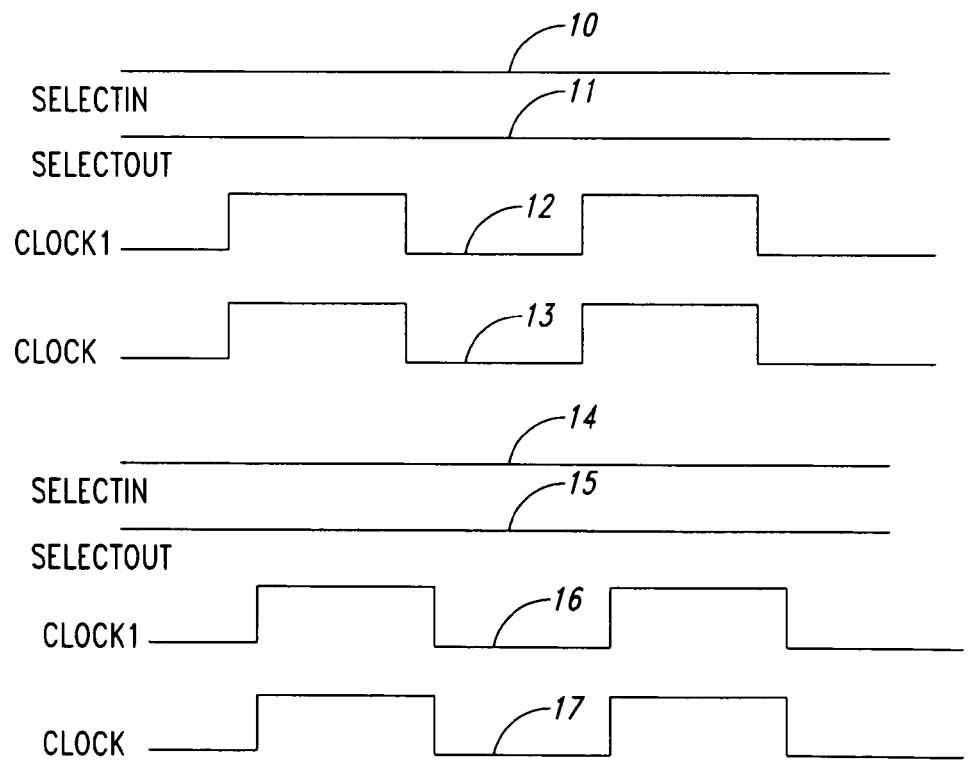
FIG. 4 shows another timing diagram.

FIG. 4 shows a timing diagram for sequential selection/operation of the selector 2 and the selection controller 4. Signal 10 is a logic high version of the SELECTIN signal and the signal 11 is the logic high version of the SELECTOUT signal. These signals are responsible for logic state initialization of the circuit. Signals 11, 12, 13 relate to the state of SELECTIN 10, and signals 15, 16, 17 relate to the state of SELECTIN 14 which is the logic low version of the SELECTIN signal.

Figure 5:
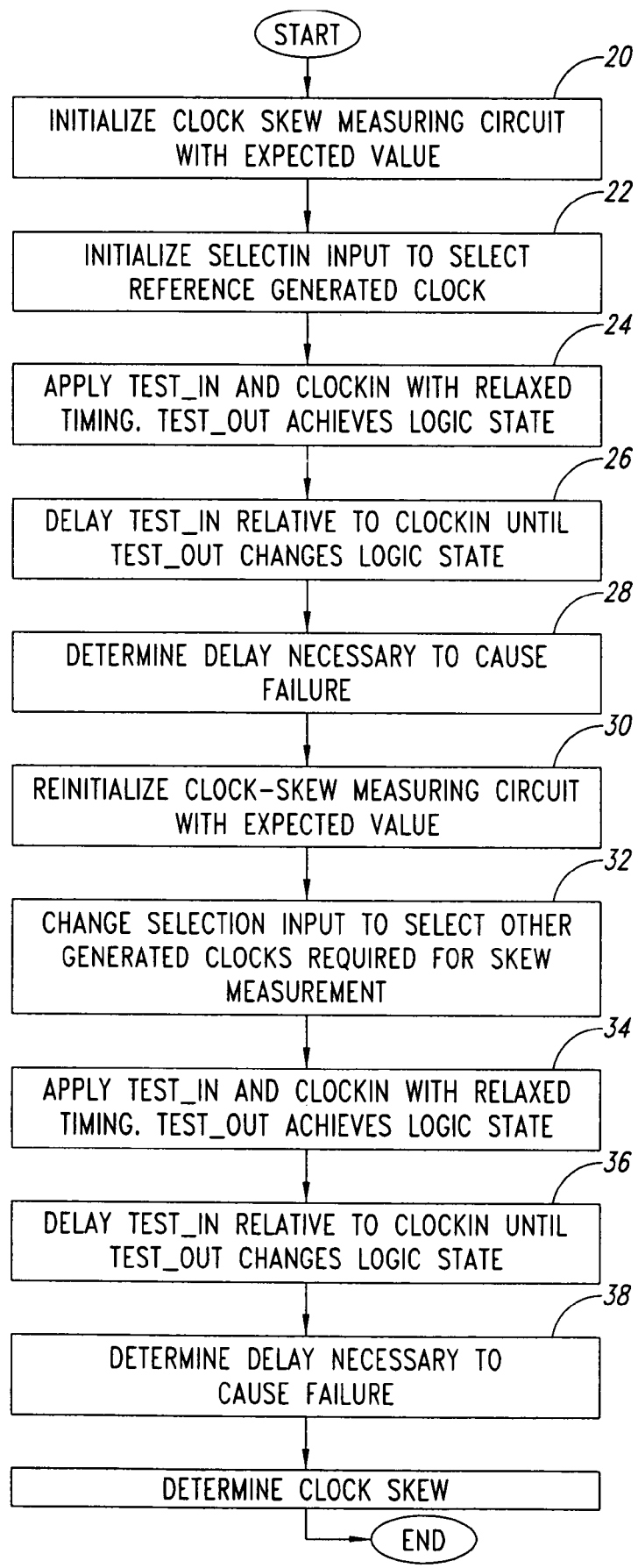
FIG. 5 shows a flow diagram for determining clock skew across two clock signals.

FIG. 5 shows a flow diagram for determining clock skew between CLOCK1 and CLOCK2 signals. The process can be implemented in a loop for determining skew between any numbers of related signals.

In the first and second steps of the flow diagram, the skew measurement circuit is initialized for an expected value of the clock skew (step 20) and the SELECTIN input pin is initialized for the reference-generated clock (step 22). The logic stage of TEST_OUT is registered in the third step after applying TEST_IN and CLOCKIN with relaxed timings (step 24). In the fourth step the TEST_IN is delayed relative to CLOCKIN until a change in logic state of the TEST_OUT is registered (step 26). The delay that causes failure is determined from the registered data (step 28).

The circuit is then reinitialized for clock skew measurement with the expected value (step 30) and SELECTIN input pin is initialized for the reference-generated clock (step 32). The logic state of TEST_OUT is registered in the next step after applying a TEST_IN and CLOCKIN with relaxed timings (step 34). The TEST_IN is then delayed relative to CLOCKIN until a change in logic state of the TEST_OUT is registered (step 36). The delay that causes failure is determined from the above registered data (step 38).

The clock skew is computed using the registered delays (step 40).

The following analysis provides the mathematical computation for determining clock skew.

The minimum of Tsu1 is referred as $Tsu_{min}1$ and of Tsu2 referred as $Tsu_{min}2$, which can be measured by observing change of TEST_OUT signals used to calculate clock skew as $$T_{skew}12 = Tsu_{min}2 - Tsu_{min}1 \tag{1}$$

Or $$T_{skew}mn = Tsu_{min}n - Tsu_{min}m \tag{2}$$

Where 'm' and 'n' are any related clocks.

The method can be used to measure data hold time with external clock to arrive at the following relationship for skew measurement $$T_{skew}12 = Thld_{min}2 - Thld_{min}1 \tag{3}$$

Or $$T_{skew}mn = Thld_{min}n - Thld_{min}m \tag{4}$$

Where $Thld_{min}2$ is the minimum data hold time which causes change of TEST_OUT state for CLOCK2. $Thld_{min}1$ is the minimum data hold time which causes change of TEST_OUT state for CLOCK1.

Figure 6:
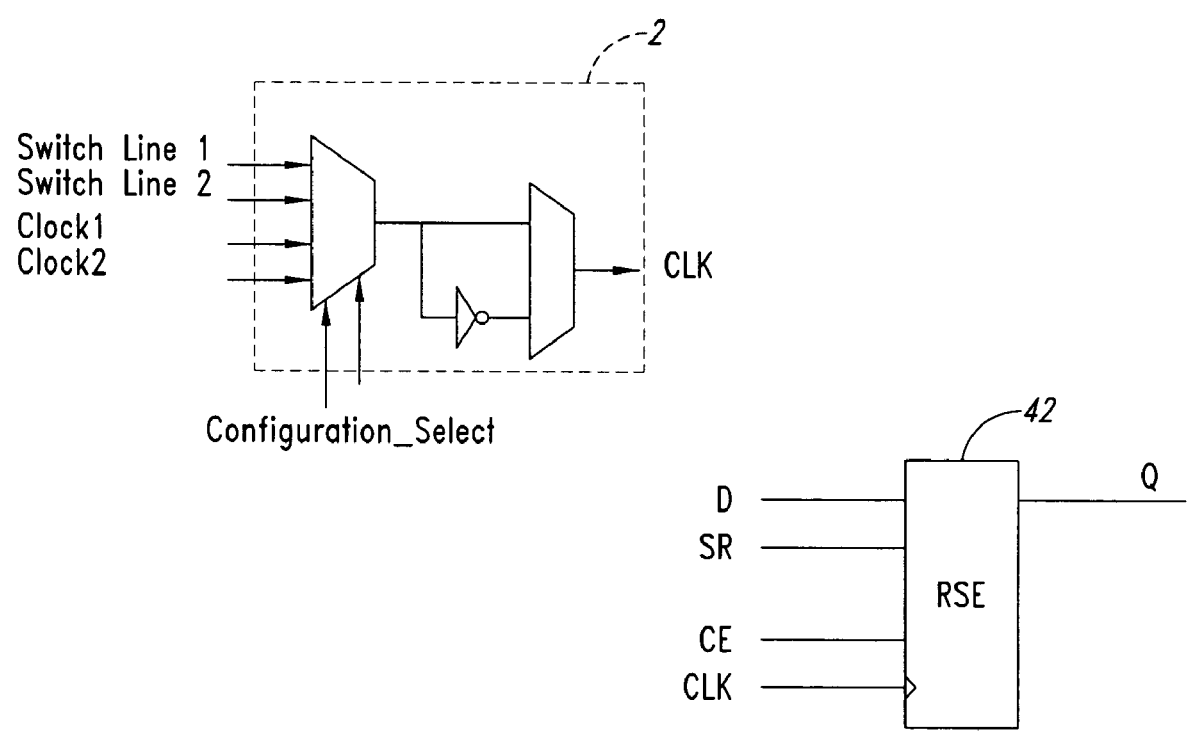
FIG. 6 shows a second embodiment of the invention using FPGAs.

FIG. 6 shows another embodiment of the invention using a field programmable gate array (FPGA). In an FPGA, reconfigurable sequential elements (RSE) 42 are clocked by several signals, which include multiple global clocks. Assume that it is desired to debug and characterize the relative skews of multiple clocks shown as Switch Line1, Switch Line2, Clock1 and Clock2.

The RSE has a data input pin D, which can be connected to the controllable clock generator 4, and data output pin Q, which can be connected to the output analyzer 5. As such, the RSE 42 can be directly controlled and observed by the tester channel. The RSE is further provided with signals SR, CE which are the set-reset and clock enable of the flip-flop. In the event of silicon test failure due to logic map function clocked by Switch Line1 and success when the same logic map function is clocked by Clock2, the system calculates relative clock skew contributing to either setup or hold failure for the RSE under test. The method provides significant advantage in device and process characterization by generating a bitmap of all RSE skew maps between multiple clock signals. This is normally not feasible due to lack of direct control over several clock signals in FPGA. The instant invention provides a solution without any additional hardware. Additionally, the skew bitmap can be back annotated to an advance timing software engine to recover functionality without over-compromising performance. Based on FPGA architecture, any internal routing track can clock an RSE and an external pin can drive the input of the RSE. This flexibility allows superior control in characterization and process yield improvement for production and offers value in advanced process development with complex FPGA designs.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A timing skew measurement system, comprising:
   selection means for receiving a plurality of input signals having a relative skew to be measured;
   selection control means connected to select inputs of said selection means for selecting one of said input signals;
   a sequential logic element having a first input connected to an output of said selection means;
   a controllable clock generator structured to provide an adjustable clock edge position connected to a second input of said sequential logic element, said first and second inputs being associated with each other by at least one defined timing relationship for correct operation of said sequential logic element; and
   an output analyzer having one input connected to an output of said sequential logic element, a first output connected to an input of said selection control means and a second output connected to a control input of said controllable clock generator.

2. The timing skew measurement system as claimed in claim 1 wherein said selection means is a multiplexer.

3. The timing skew measurement system as claimed in claim 1 wherein said sequential logic element is a D-flipflop.

4. The timing skew measurement system as claimed in claim 1 wherein said controllable clock generator and said output analyzer are elements of an automatic test system device.

5. The timing skew measurement system as claimed in claim 1 wherein said sequential logic element is a reconfigurable signal element of a field programmable gate array.

6. A method for performing timing skew measurement, comprising the steps of:
   a. selecting one of a plurality of input signals having relative skew to be measured;
   b. applying the selected input signal to a first input of a sequential logic element;
   c. applying an adjustable clock signal to a second input of said sequential logic element to maintain defined timing relative to said first input for a first operation of said sequential logic element;
   d. analyzing an output of said sequential logic element for correctness;
   e. adjusting a clock edge position of said controllable clock signal until a behavior of said sequential logic element changes from the first operation to a second operation and recording the clock edge position for such transition;
   f. selecting each of the input signals in turn and repeating the sequence of steps b) to e) until all of the input signals have been processed, and
   g. determining timing skew between said input signals by comparing values obtained in step e) for each input signal.

7. The method as claimed in claim 6 wherein the first operation is proper operation and the second operation is incorrect operation.

8. A timing skew measurement system, comprising:
   a selector receiving first and second input signals having a relative skew to be measured;
   a selection controller connected to the selector for sequentially selecting the input signals;
   a sequential logic element having a first input, connected to an output of the selector; a second input; and an output, the first and second inputs being associated with each other by a defined timing relationship for correct operation of the sequential logic element;
   a controllable clock generator structured to provide an adjustable clock signal connected to the second input of the sequential logic element; and
   an output analyzer having an input connected to the output of said sequential logic element and structured to determine a first delay of the first input signal compared to the adjustable clock signal, a second delay of the second input signal compared to the adjustable clock signal, and the relative skew based on the first and second delays.

9. The timing skew measurement system of claim 8 wherein the selector is a multiplexer.

10. The timing skew measurement system of claim 8 wherein the sequential logic element is a D-flipflop.

11. The timing skew measurement system of claim 8 wherein the controllable clock generator and the output analyzer are elements of an automatic test system device.

12. The timing skew measurement system of claim 8 wherein the sequential logic element is a reconfigurable signal element of a field programmable gate array.

13. The timing skew measurement system of claim 8 wherein the output analyzer has a first output connected to a control input of the adjustable clock generator.

14. The timing skew measurement system of claim 13 wherein the output analyzer has a second output connected to a control input of the selection controller.

15. An automatic test system device for use with a sequential logic element having a first input, sequentially receiving first and second input signals having a relative skew to be measured; a second input; and an output, the first and second inputs being associated with each other by a defined timing relationship for correct operation of the sequential logic element, the automatic test system device comprising:

a controllable clock generator structured to provide an adjustable clock signal to the second input of the sequential logic element; and an output analyzer having an input for connection to the output of said sequential logic element and structured to determine a first delay of the first input signal compared to the adjustable clock signal, a second delay of the second input signal compared to the adjustable clock signal, and the relative skew based on the first and second delays.

16. The automatic test system device of claim 15 wherein the sequential logic element is part of the automatic test system device.

17. The automatic test system device of claim 16 wherein the sequential logic element is a D-flipflop.

18. The automatic test system device of claim 16 wherein the sequential logic element is a reconfigurable signal element of a field programmable gate array.

19. The automatic test system device of claim 15 wherein the output analyzer has a first output connected to a control input of the adjustable clock generator.

* * * * *